United States Patent
Erdmann et al.

(10) Patent No.: US 10,483,996 B1
(45) Date of Patent: Nov. 19, 2019

(54) TIME SKEW CALIBRATION OF TIME-INTERLEAVED ANALOG TO DIGITAL CONVERTERS

(71) Applicant: Xilinx, Inc., San Jose, CA (US)

(72) Inventors: Christophe Erdmann, Dublin (IE); Bob W. Verbruggen, Dublin (IE); Ali Boumaalif, Cork City Centre (IE); Bruno Miguel Vaz, Sao Domingos de Rana (PT)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/991,539

(22) Filed: May 29, 2018

(51) Int. Cl.
H03M 1/12 (2006.01)
G06F 1/10 (2006.01)
H03M 1/66 (2006.01)
H03M 1/06 (2006.01)

(52) U.S. Cl.
CPC .............. *H03M 1/121* (2013.01); *G06F 1/10* (2013.01); *H03M 1/0624* (2013.01); *H03M 1/0656* (2013.01); *H03M 1/662* (2013.01)

(58) Field of Classification Search
CPC ... H03M 1/121; H03M 1/0624; H03M 1/0656
USPC .................. 341/155, 120, 159, 188
See application file for complete search history.

(56) References Cited

U.S. PATENT DOCUMENTS

| | | | | |
|---|---|---|---|---|
| 7,250,885 B1* | 7/2007 | Nairn | ................... | H03M 1/1215 341/141 |
| 8,604,952 B2* | 12/2013 | Kidambi | ............. | H03M 1/0604 341/118 |
| 8,830,094 B1 | 9/2014 | Erdmann | | |
| 9,270,291 B1* | 2/2016 | Parnaby | ................ | H04L 7/0004 |
| 2013/0058437 A1* | 3/2013 | Oshima | ............... | H03M 1/0836 375/316 |
| 2016/0079994 A1* | 3/2016 | Lee | ........................ | H03M 1/002 341/118 |
| 2017/0093415 A1* | 3/2017 | Zortea | ................. | H03M 1/1033 |

* cited by examiner

*Primary Examiner* — Peguy Jean Pierre
(74) *Attorney, Agent, or Firm* — Craige Thompson

(57) ABSTRACT

Apparatus and associated methods relate to modulating polarity on sample outputs from a time-interleaved analog-to-digital converter (TIADC) as an input to a time skew extractor in a clock skew calibration control loop. In an illustrative example, a multiplier-mixer may impart a polarity change to every other data sample transmitted between the TIADC and the time skew extractor. In some examples, a multiplexer may select between the polarity modulated samples and non-polarity modulated samples before the multiplier-mixer. Selection between the polarity modulated samples and the non-polarity modulated samples may be based on, for example, determination of specific frequency bands of an analog input signal. Various embodiments may improve convergence of clock skew calibration control loops for analog input signals sampled with a TIADC near a Nyquist frequency.

18 Claims, 18 Drawing Sheets

US 10,483,996 B1

TIME SKEW CALIBRATION OF TIME-INTERLEAVED ANALOG TO DIGITAL CONVERTERS

TECHNICAL FIELD

Various embodiments relate generally to time skew calibration techniques in high-speed digital circuits, specifically their use in time-interleaved analog-to-digital converters.

BACKGROUND

Various modern applications may use arrays of analog-to-digital converters (ADCs) to achieve increased bandwidth without an appreciable increase in power consumption. Some arrays of analog-to-digital converters may be time interleaved forming a time-interleaved analog-to-digital converter (TIADC). For example, two or more ADCs having a defined clocking relationship may simultaneously sample an input signal and produce a combined output signal. The combined output signal of a set of interleaved ADCs results in a sampling bandwidth that is a multiple of the sampling bandwidths of the individual ADCs. The effective sampling rate can be increased by a factor that is equal to the number of ADCs implemented. For example, two equivalent time-interleaved ADCs may have a combined sampling bandwidth that is twice the sample rate of the individual ADCs.

In many product sectors (e.g., industrial, commercial, aerospace, wireless, computing) TIADCs may offer specific advantages. For example, in the aerospace industry TIADCs may be implemented in various communication systems, video surveillance, or high-frequency location systems. In various communication systems, engineering design teams may be challenged to increase analog-to-digital sampling rates and accordingly, may be forced into some form of TIADC solution to support, for example, backhaul modems and high speed remote radio heads in wireless network communications.

SUMMARY

Apparatus and associated methods relate to modulating polarity on sample outputs from a time-interleaved analog-to-digital converter (TIADC) as an input to a time skew extractor in a clock skew calibration control loop. In an illustrative example, a multiplier-mixer may impart a polarity change to every other data sample transmitted between the TIADC and the time skew extractor. In some examples, a multiplexer may select between the polarity modulated samples and non-polarity modulated samples before the multiplier-mixer. Selection between the polarity modulated samples and the non-polarity modulated samples may be based on, for example, determination of specific frequency bands of an analog input signal. Various embodiments may improve convergence of clock skew calibration control loops for analog input signals sampled with a TIADC near a Nyquist frequency.

Various embodiments may achieve one or more advantages. For example, some embodiments may improve the convergence accuracy of various clock skew calibration control loop implementations. Various embodiments may specifically improve accuracy and signal to noise ratio for analog input signals close to a Nyquist frequency, which may minimize time-interleaving spurs and may result in a substantially optimum noise floor. In some embodiments, specific combinations of polarity modulated samples and non-polarity modulated samples may remove various zoning conditions and may be effective for input frequencies within one Nyquist band. Various embodiments may substantially eliminate or avoid the loss in performance close to the Nyquist frequency by keeping the clock skew calibration implementations accurate.

Various time skew extractors incorporating an adder front-end to add a current TIADC sample with a previous TIADC sample, may provide the benefits identified for embodiments which insert the multiplier-mixer between the TIADC and a time skew extractor with the existing subtractor front-end. For example, various time skew extractors incorporating an adder front-end may improve the convergence accuracy of various clock skew calibration control loop implementations. Various time skew extractors incorporating an adder front-end may specifically improve accuracy and signal to noise ratio for analog input signals close to a Nyquist frequency, which may minimize time-interleaving spurs and may result in a substantially optimum noise floor. In some time skew extractors incorporating an adder front-end may remove various zoning conditions and may be effective for input frequencies within one Nyquist band. Various time skew extractors incorporating an adder front-end may substantially eliminate or avoid the loss in performance close to the Nyquist frequency by keeping the clock skew calibration implementations accurate.

In an exemplary aspect, a clock skew calibration apparatus or method may involve an array of N time-interleaved analog-to-digital converters (TIADCs) receiving an analog input signal and configured to generate a stream of originating samples in a digital format, wherein the stream rate is one sample per period of an overall sampling clock (sclk) having a sampling frequency $f_S$, and wherein the TIADCs are configured to receive an array of sampling clocks each having an individual sampling frequency of substantially $f_S/N$. The apparatus may include a sign changer circuit configured to receive the stream of originating samples and to generate a stream of mixed samples at the sampling frequency $f_S$, wherein the stream of mixed samples alternates between a sample that is a direct copy of the originating sample and a sign changed copy of the originating sample. A time skew extractor may be adapted to receive the stream of mixed samples and to produce an array of clock error signals as a function of the stream of mixed samples. An adjustable clock generator may be adapted to receive the array of clock error signals and to produce the array of sampling clocks.

In some embodiments, the apparatus may further include an offset and gain correction circuit configured to receive the stream of originating samples, to correct offset and gain of each sample in the stream of originating samples, and to send the offset and gain corrected stream of originating samples to the time skew extractor. The time skew extractor may be further adapted to receive the stream of originating samples and to produce the array of clock error signals as a function of the stream of mixed samples and the stream of originating samples. The apparatus may further include a selector configured to receive the stream of originating samples and to receive the stream of mixed samples and configured to send a selected one of the received sample streams to the time skew extractor in response to a selection control signal. The selector may be configured to select between the received sample streams as a function of a frequency of the analog input signal relative to a Nyquist frequency associated with the sampling frequency $f_S$.

In some implementations, the sign changer circuit may further include a sign toggler configured to generate a stream of unity magnitude signals with alternating sign in response to the overall sampling clock (sclk). The sign changer circuit may further include a multiplier configured to receive the stream of unity magnitude signals with alternating sign at the sampling frequency $f_S$.

In some embodiments, the time skew extractor may include a first subtractor having an input coupled to the stream of mixed samples, and a first flip flop having an input coupled to the stream of mixed samples, wherein an output of the first flip flop is coupled to an input of the first subtractor. The output of the first subtractor may be coupled to a first bit manipulator for generating first absolute values of the output of the first subtractor. The time skew extractor may further include a second subtractor having an input coupled to the stream of originating samples, and a second flip flop having an input coupled to the stream of originating samples. An output of the second flip flop may be coupled to an input of the second subtractor. The output of the second subtractor may be coupled to a second bit manipulator for generating second absolute values of the output of the second subtractor. The first and second absolute values may be combined according to a combining function and sent to an error processor. The combining function may include subtraction.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

To aid understanding, this document is organized as follows. First, an exemplary FPGA is briefly introduced, with reference to FIG. 1. Second, with reference to FIGS. 2A, 2B and 2C, an exemplary time-interleaved analog-to-digital converter clock manipulator (TIADCCM) application is introduced with associated graphs that explain exemplary improvements in noise reduction. Next, with reference to FIGS. 3-16 the discussion turns to exemplary embodiments that illustrate an alternating polarity mixer inserted between a time-interleaved analog-to-digital converter TIADC and a time skew extraction subsystem.

Figure 1:
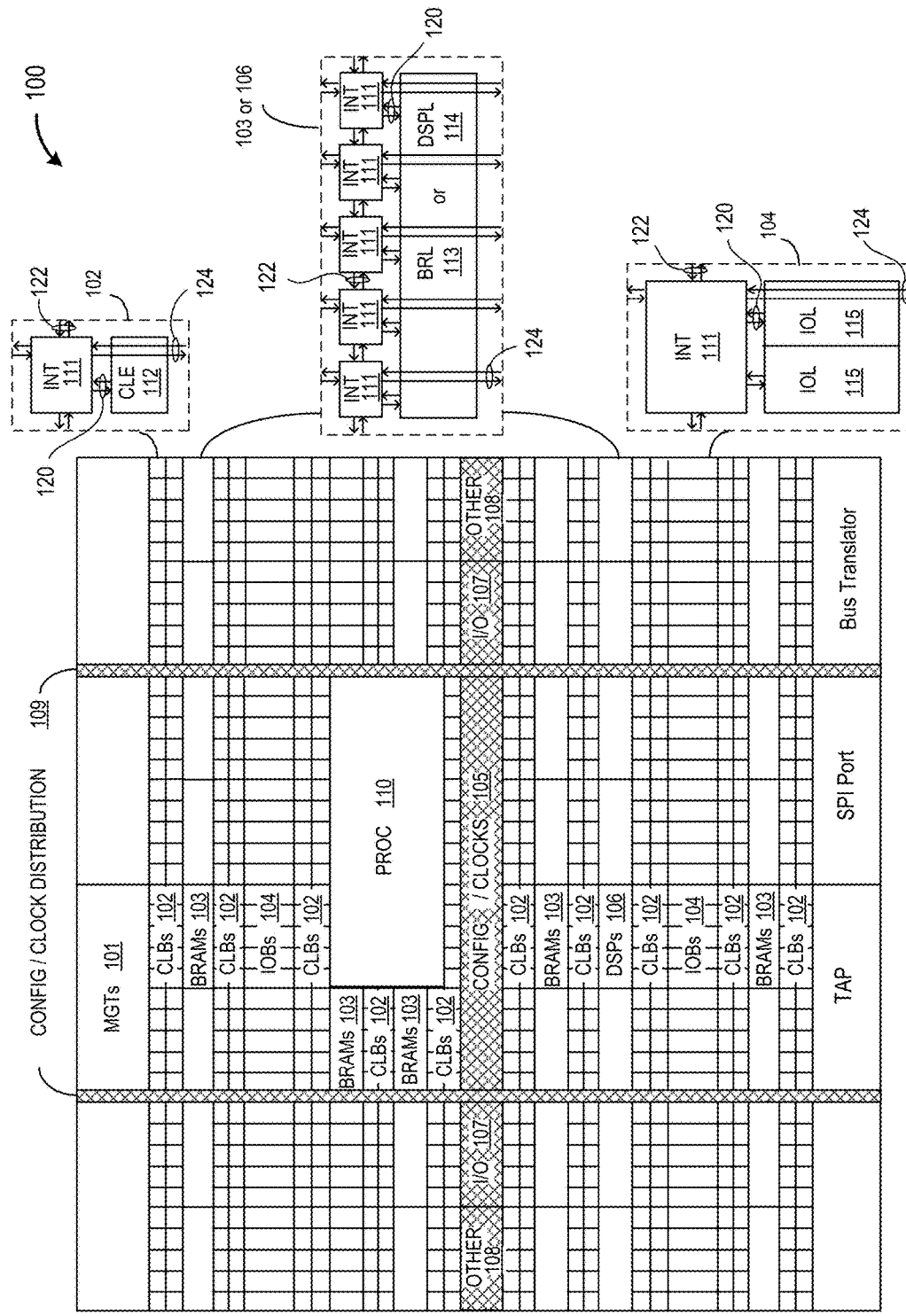
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. A programmable IC 100 includes FPGA logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An IOB 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

Figure 2A:
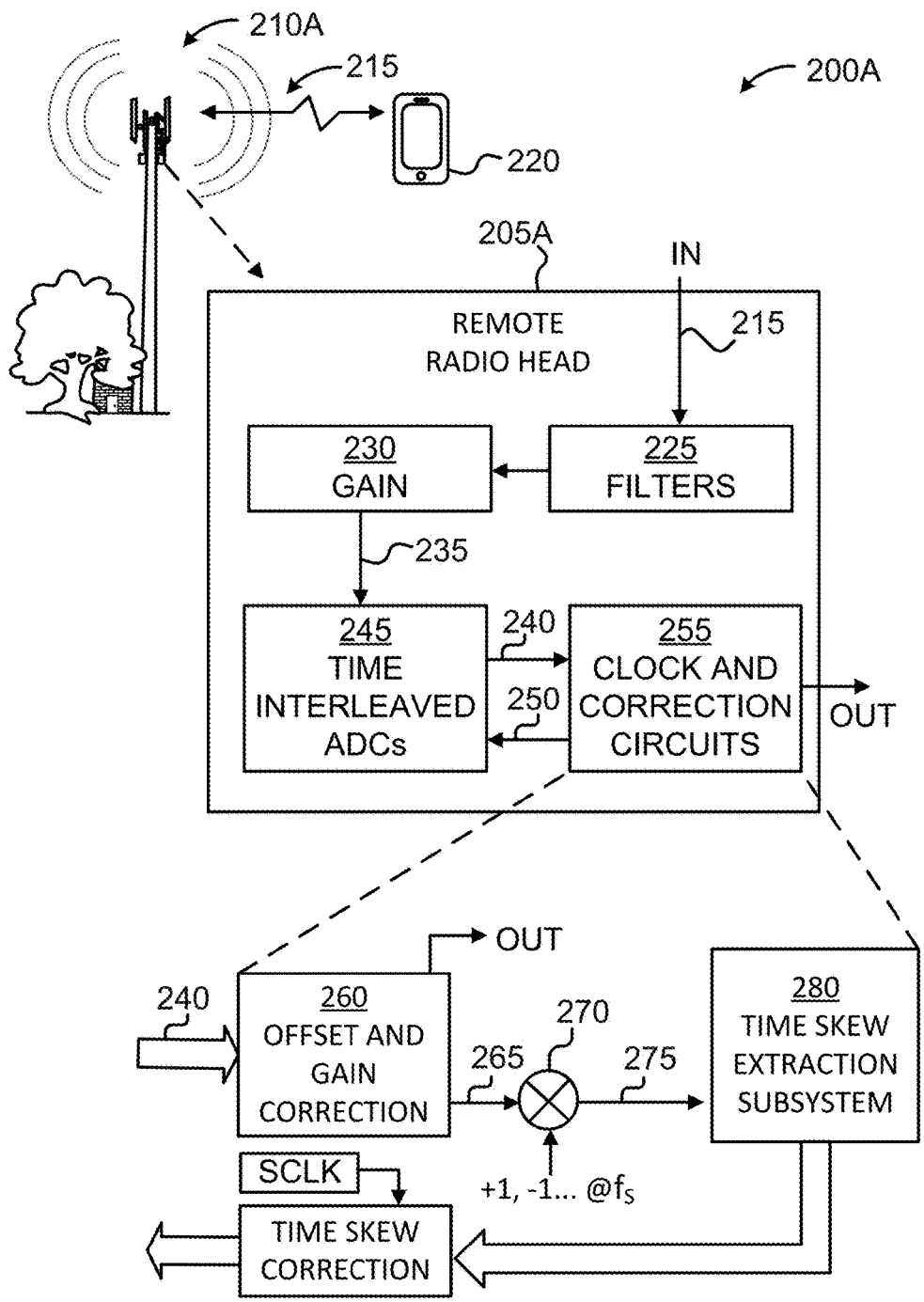
FIG. 2A depicts an exemplary time-interleaved analog-to-digital converter clock manipulator (TIADCCM) employed in a remote radio head coupled to an antenna at a cell site.

FIG. 2A depicts an exemplary time-interleaved analog-to-digital converter clock manipulator (TIADCCM) employed in a remote radio head coupled to an antenna at a cell site. A use case scenario 200A includes a remote radio head 205A. The remote radio head 205A is implemented at a cell site 210A. The cell site 210A receives a radio frequency (RF) cellular communication signal 215 from various mobile cellular devices 220, for example. The RF cellular communication signal 215 is routed to the remote radio head 205A. At the remote radio head 205A, the RF cellular communication signal 215 is filtered by a filter circuit 225 and amplified by a gain circuit 230. An analog output 235 of the gain circuit 230 is converted to a digital data signal 240 by an array of high-speed time-interleaved analog-to-digital converters (TIADCs) 245. The array of TIADCs 245 are clocked by a calibrated clock signal 250 received from a high-speed clock and correction circuit (CCC) 255. The CCC 255 includes an offset and gain correction circuit 260. The offset and gain correction circuit 260 is operable to receive the digital data signal 240 and to generate a data stream 265. The CCC 255 includes an alternating polarity mixer 270. The alternating polarity mixer 270 is operable to receive the data stream 265, to reverse the sign on every other sample in the data stream 265, and to send a resulting mixed data stream 275 to a time skew extraction subsystem 280. Various examples of time skew extraction subsystems 280 that may be suitable for some embodiments are described, for example, with reference to FIGS. 2-5, 7 and 8 in U.S. patent application Ser. No. 14/132,277, titled "Time Skew Extraction of Interleaved Analog-To-Digital Converters," filed by Christophe Erdmann on Dec. 18, 2013 (Erdmann-2013), the entire disclosure of which is hereby incorporated by reference. Various alternating polarity mixers, such as the alternating polarity mixer 270, may provide a mixed data stream, such as the mixed data stream 275, to various time skew extraction subsystems to advantageously reduce conversion spurs and to facilitate TIADC 245 convergence.

Figure 2B:
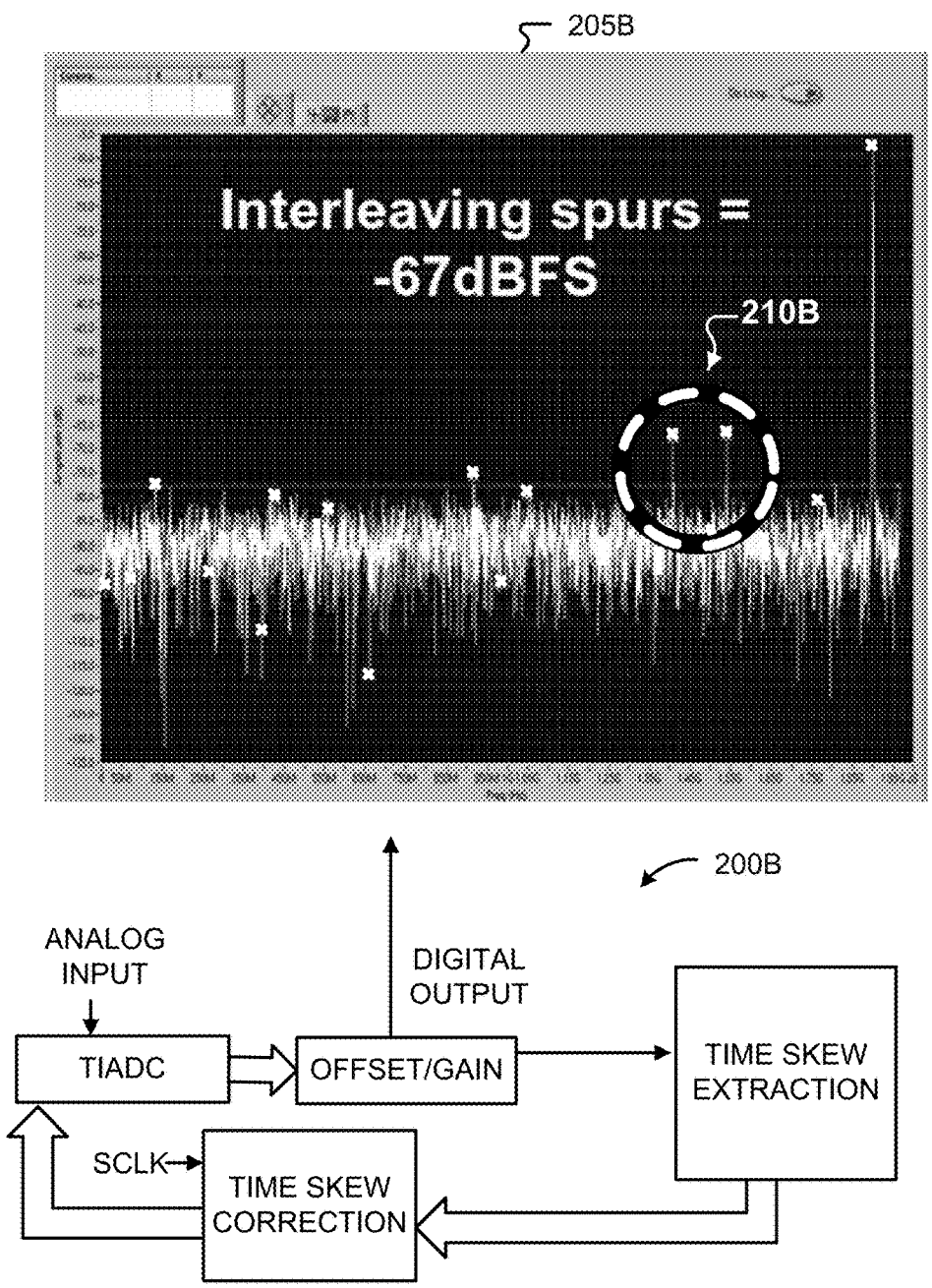
FIG. 2B depicts a graph of interleaving spurs resulting from an exemplary time-interleaved analog-to-digital converter clock manipulator (TIADCCM) without an alternating polarity mixer.

FIG. 2B depicts a graph of interleaving spurs resulting from an exemplary time-interleaved analog-to-digital converter (ADC) clock manipulator (TIADCCM) without an alternating polarity mixer. A TIADCCM 200B is shown as operating without an alternating polarity mixer. Accordingly, a generated digital output 205B produces interleaving spurs 210B at −67 dBFS (decibels relative to a full scale of an ADC).

Figure 2C:
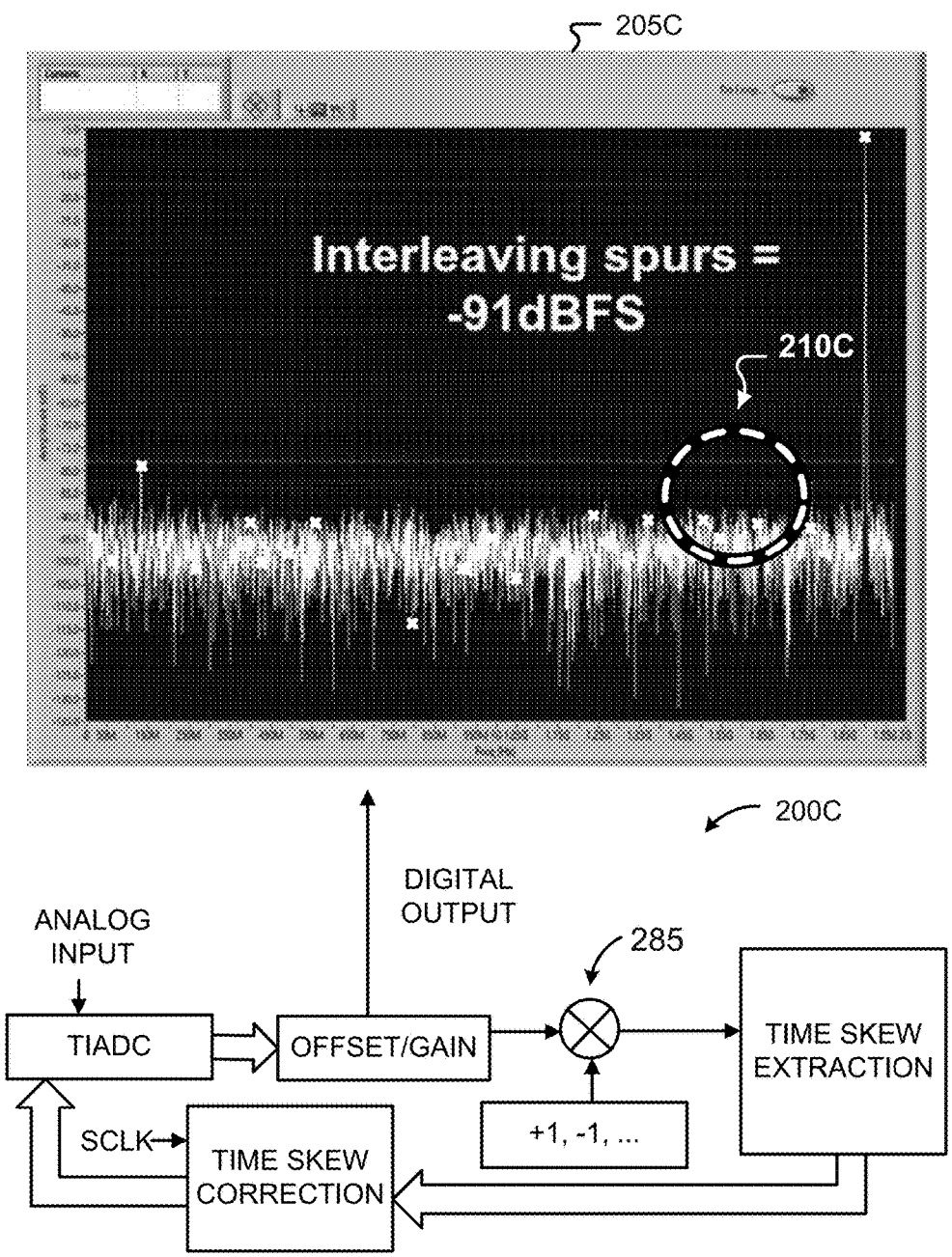
FIG. 2C depicts a graph of reduced interleaving spurs resulting from an exemplary time-interleaved analog-to-digital converter clock manipulator (TIADCCM) with an alternating polarity mixer.

FIG. 2C depicts a graph of reduced interleaving spurs resulting from an exemplary time-interleaved analog-to-digital converter clock manipulator (TIADCCM) with an alternating polarity mixer 285. A TIADCCM 200C is shown as operating with an alternating polarity mixer. Accordingly, a generated digital output 205C produces a substantially attenuated interleaving spur 210C at −91 dBFS.

Figure 3:
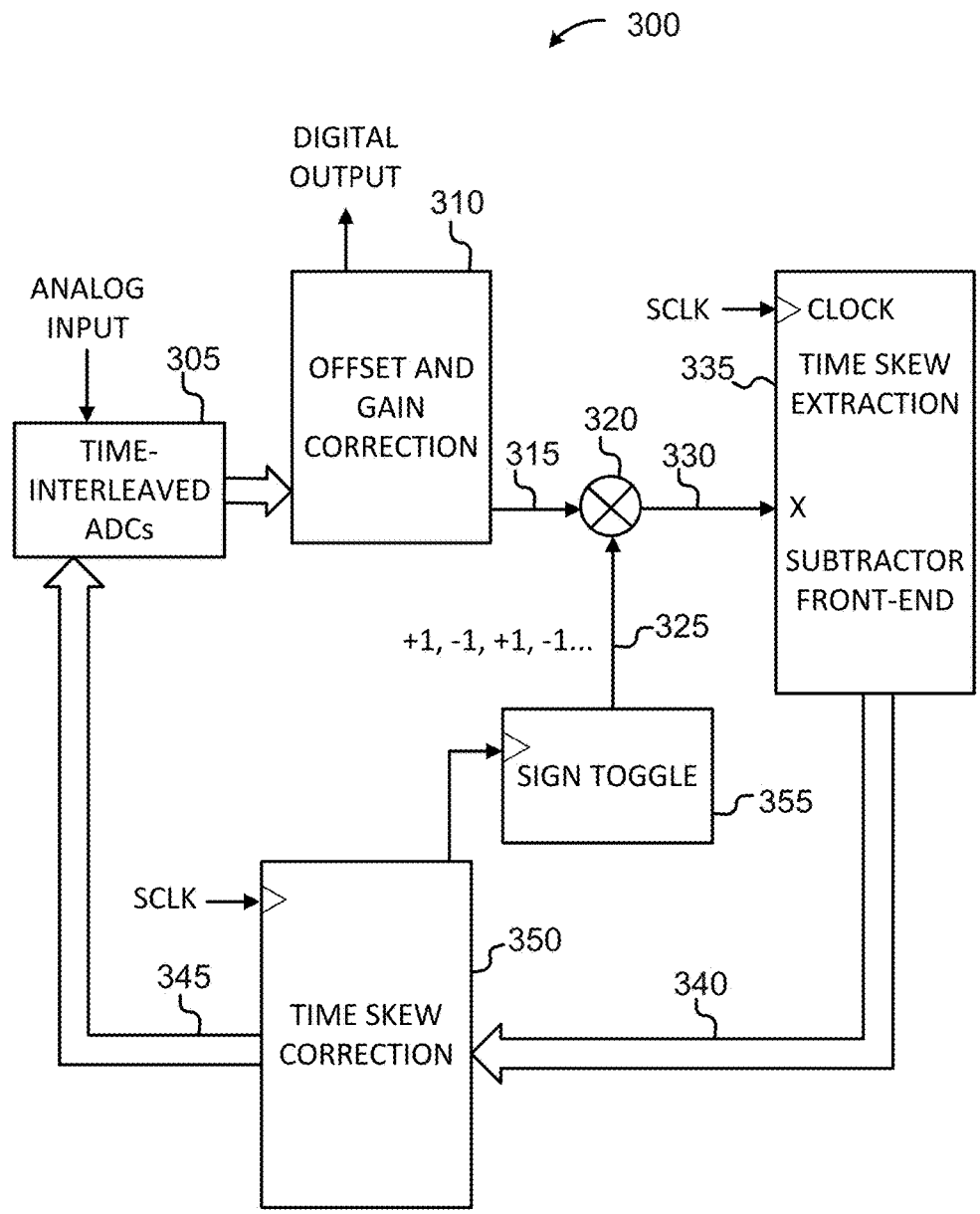
FIG. 3 depicts an exemplary clock skew calibration control loop, having a multiplier-mixer configured to pass mixed sample data from a time-interleaved analog-to-digital converter (TIADC) to a time skew extraction subsystem, the mixed sample data being offset corrected, gain corrected, and reverse polarized on every other sample.

FIG. 3 depicts an exemplary clock skew calibration control loop, having a multiplier-mixer configured to pass mixed sample data from a time-interleaved analog-to-digital converter (TIADC) to a time skew extraction subsystem, the mixed sample data being offset corrected, gain corrected, and reverse polarized on every other sample. A clock skew calibration control loop 300 includes an array of time-interleaved analog-to-digital converters (TIADCs) 305. The TIADCs 305 send time-interleaved data to an offset and gain correction circuit 310. The offset and gain correction circuit 310 sends a stream of converted and corrected data (SCACD) 315 to a multiplier-mixer 320. The multiplier-mixer 320 also receives a stream of positive and negative ones (SPNOs) 325 in an alternating fashion. The SPNOs 325 in combination with the SCACD 315 cause the multiplier-mixer 320 to produce a mixed SCACD 330, such that every other sample in the mixed SCACD 330 has a reverse polarity of the SCACD 315.

The mixed SCACD 330 is sent to a time skew extraction subsystem 335. Various time skew extraction subsystems such as the time skew extraction subsystem 335 may be described, for example, in Erdmann-2013. The time skew extraction subsystem 335 is operable to produce a set of error signals 340. Each error signal in the set of error signals 340 may represent a correction factor for a corresponding clock in a set of TIADC clocks 345. A time skew correction block 350 is configured to adjust the timing of each of the TIADC clocks in the set of TIADC clocks 345 as a function of the corresponding error signal in the set of error signals 340. The set of TIADC clocks 345 are received by the TIADCs 305. The SPNOs 325 are generated by a sign toggle method 355. The sign toggle method 355 is clocked by the time skew correction block 350. Accordingly, the multiplier-mixer 320 producing a reverse sign polarity on every other data sample (e.g., producing the mixed SCACD 330 on the SCACD 315) coupled to the input of the time skew extraction subsystem 335 may facilitate loop control of a set of clocking signals to an associated array of TIADCs such that the calibration accuracy of the converted data may exceed the calibration accuracy of systems without a sign polarity reversal from a multiplier-mixer, in specific frequency bands.

Figure 4:
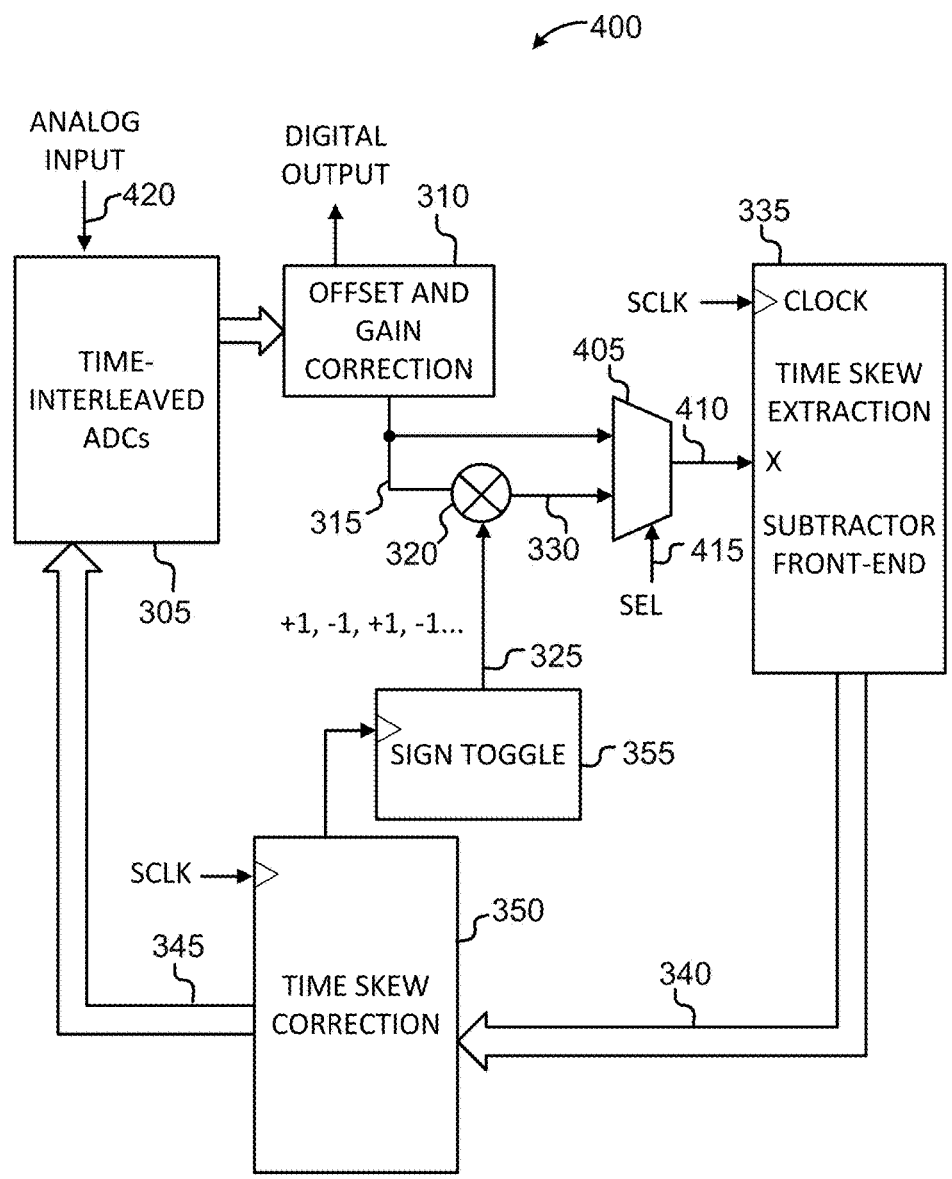
FIG. 4 depicts an exemplary clock skew calibration control loop, having a multiplexer operable to select between mixed sample data and non-mixed sample data.

FIG. 4 depicts an exemplary clock skew calibration control loop, having a multiplexer operable to select between mixed sample data and non-mixed sample data. A clock skew calibration control loop 400 includes the elements and configurations detailed with reference to FIG. 3 with the following modifications. The SCACD 315, which may be referred to as "non-mixed data" and the mixed SCACD 330, which may be referred to as "mixed data" are coupled to two inputs of a multiplexer 405. The multiplexer 405 produces a selected output 410. The selected output 410 is controlled by a selection input on the multiplexer 405. In the depicted example, the selection input is controlled by a SEL signal 415. The SEL signal 415 may be operated by a controller. The controller may determine a frequency band of an analog input 420 and may select mixed data or non-mixed data based on a determined frequency band. The selected output 410 is received by the time skew extraction subsystem 335. Accordingly, the selection of mixed or non-mixed data may advantageously provide the highest calibration accuracy for a given frequency band automatically.

Figure 5:
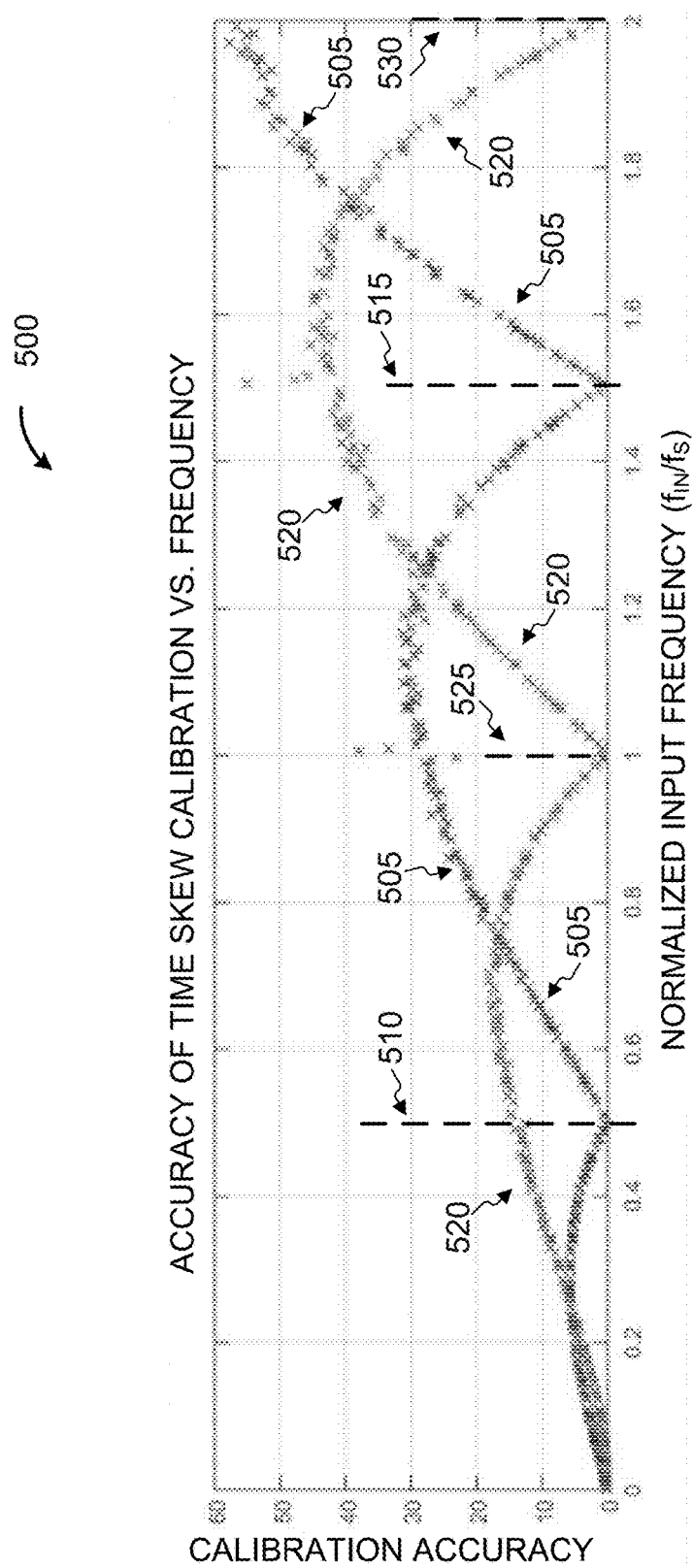
FIG. 5 depicts a simulated graph of calibration accuracy vs. a normalized sampling frequency with and without a multiplier-mixer.

FIG. 5 depicts a simulated graph of calibration accuracy vs. a normalized sampling frequency with and without a multiplier-mixer. In a depicted exemplary graph 500, a calibration accuracy of non-mixed data 505 is worst as an analog input frequency $f_{IN}$ approaches half of the sampling frequency ($0.5*f_S$) 510 (e.g., the Nyquist frequency) and at 1.5 times the sampling frequency ($1.5*f_S$) 515. In some examples, the calibration accuracy of non-mixed data 505 may be worst as the analog input frequency $f_{IN}$ approaches substantially $(n+0.5)*f_S$ where n is a whole number (0, 1, 2 . . . ).

In the depicted exemplary graph 500, the accuracy of mixed data 520 is worst as analog input frequency $f_{IN}$ approaches the sampling frequency ($f_S$) 525 and at twice the sampling frequency ($2*f_S$) 530. In some examples, the accuracy of mixed data 520 may be worst as the analog input frequency $f_{IN}$ approaches substantially $(n+1)*f_S$.

Figure 6:
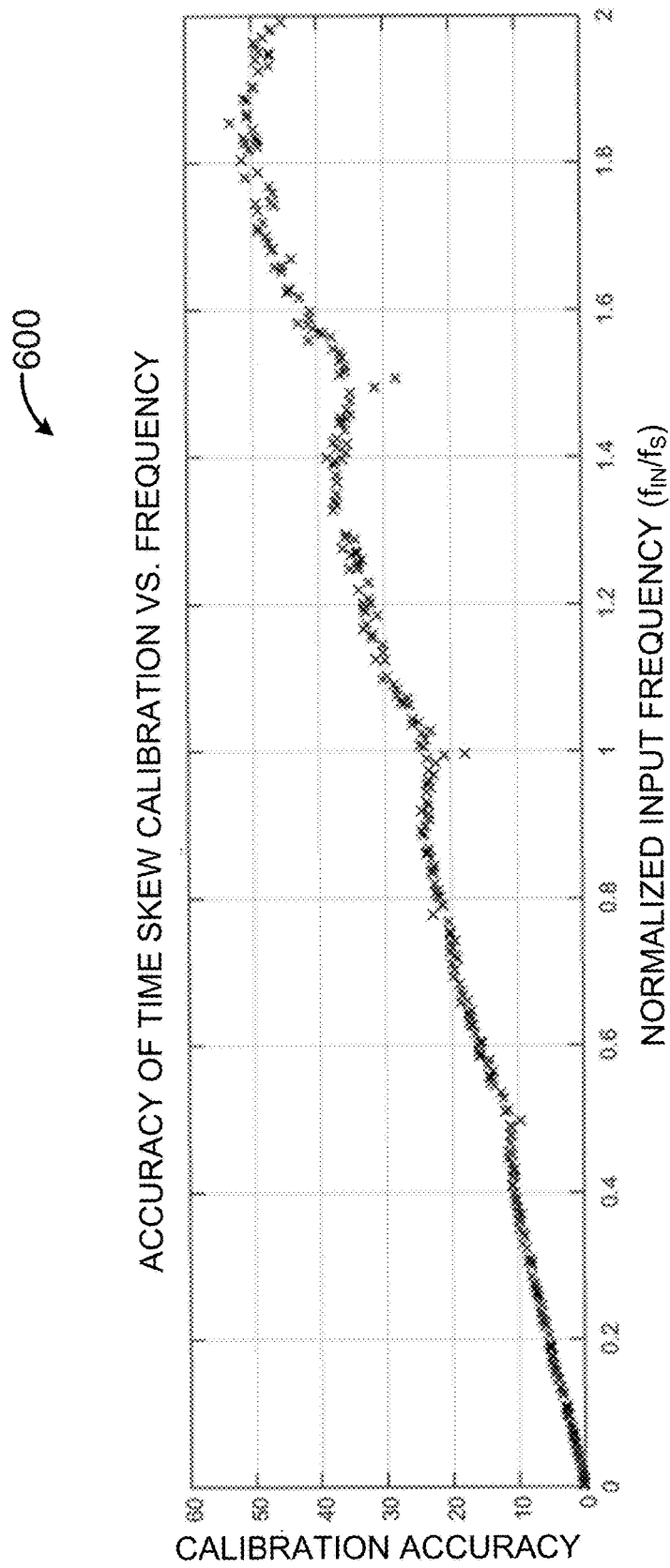
FIG. 6 depicts a combined simulated graph of calibration accuracy vs. a normalized sampling frequency.

FIG. 6 depicts a combined simulated graph of calibration accuracy vs. a normalized sampling frequency. A difference between the non-mixed data 505 (e.g., without a multiplier-mixer) and the mixed data 520 (e.g., with a multiplier-mixer) is depicted in a resulting exemplary graph 600. The resulting exemplary graph 600 illustrates a substantially linear relationship between accuracy and normalized input sampling frequency. In various TIADCCM systems, increased calibration accuracy may be achieved across multiple Nyquist zones by implementation of a multiplier-mixer producing mixed data samples and determining a difference between the mixed data samples and non-mixed data samples.

Figure 7:
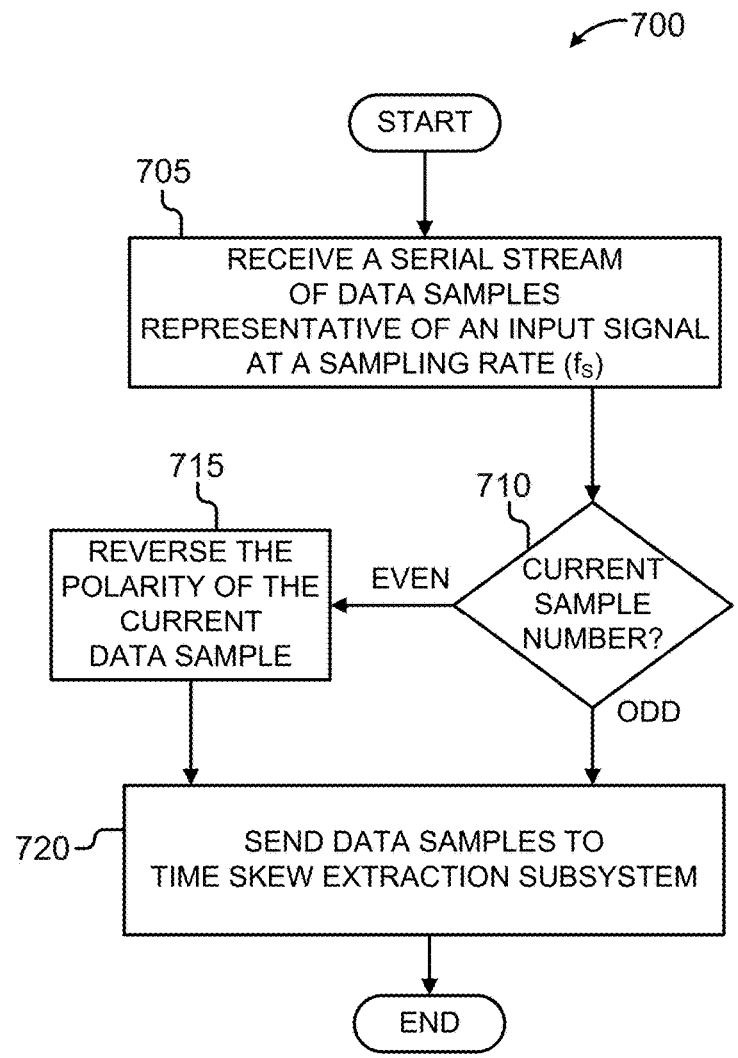
FIG. 7 depicts a flowchart of an exemplary time-interleaved analog-to-digital converter clock manipulator (TIADCCM) method.

FIG. 7 depicts a flowchart of an exemplary time-interleaved analog-to-digital converter clock manipulator (TIADCCM) method. Execution of a TIADCCM method 700 begins at process block 705 where the method 700 receives a serial stream of data samples representative of an input signal at a sampling rate ($f_S$). Next, at process block 710 the method 700 determines a sample number of the serial stream of data samples. In the depicted example, if the current sample number is even, then the method 700 reverses the polarity of the current sample's data value at process block 715. The method 700 then continues to process block 720. At process block 710, if the current sample number is odd, then the method 700 leaves the polarity of the current sample's data value intact, then continues to process block 720. At process block 720 the method 700 sends data samples to a time skew extraction subsystem.

In various implementations, the impetus of process block 710 may be to reverse the polarity of every other sample. Accordingly, the method 700 may reverse the determination of "odd" and "even" at process block 710, for example.

Figure 8:
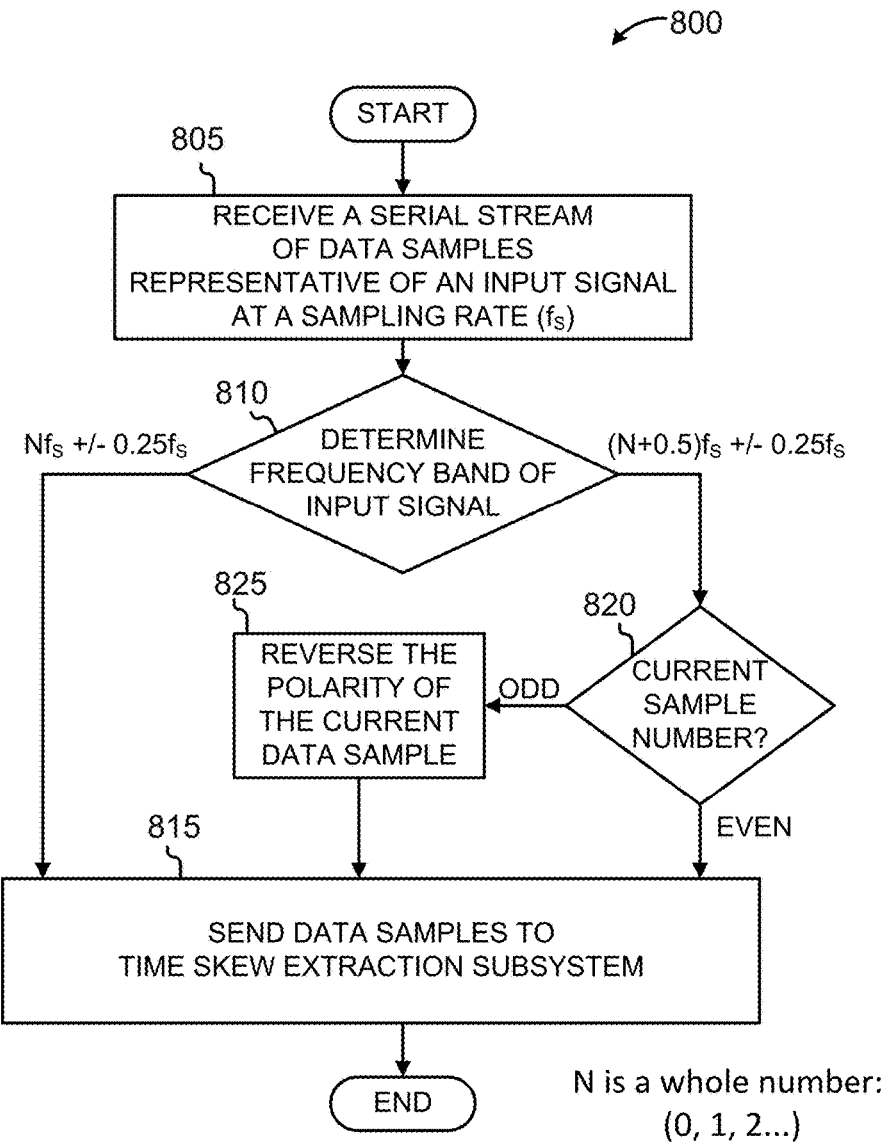
FIG. 8 depicts a flowchart of an exemplary time-interleaved analog-to-digital converter clock manipulator (TIADCCM) method.

FIG. 8 depicts a flowchart of an exemplary time-interleaved analog-to-digital converter clock manipulator (TIADCCM) method. Execution of a TIADCCM method 800 begins at process block 805 where the method 800 receives a serial stream of data samples representative of an input signal at a sampling rate ($f_S$). Next, at process block 810 the method 800 determines the frequency band of an input signal. At process block 810, if the input signal is within a frequency band of $Nf_S+/-0.25f_S$, then execution continues to process block 815. At process block 815 the method 800 sends data samples to a time skew extraction subsystem.

At process block 810, if the input signal is within a frequency band of $(N+0.5)f_S+/-0.25f_S$, then execution continues to process block 820. At process block 820, the method 800 determines a sample number of the serial stream of data samples. At process block 820 of the depicted example, if the current sample number is odd, then the method 800 continues to process block 825 where the method 800 reverses the polarity of the current sample's data value. The method 800 then continues to process block 815. At process block 820, if the current sample number is even, then the method 800 leaves the polarity of the current sample's data value intact, then continues to process block 815.

In various implementations, the impetus of process block 820 may be to reverse the polarity of every other sample. Accordingly, the method 800 may reverse the determination of "odd" and "even" at process block 820, for example.

Figure 9:
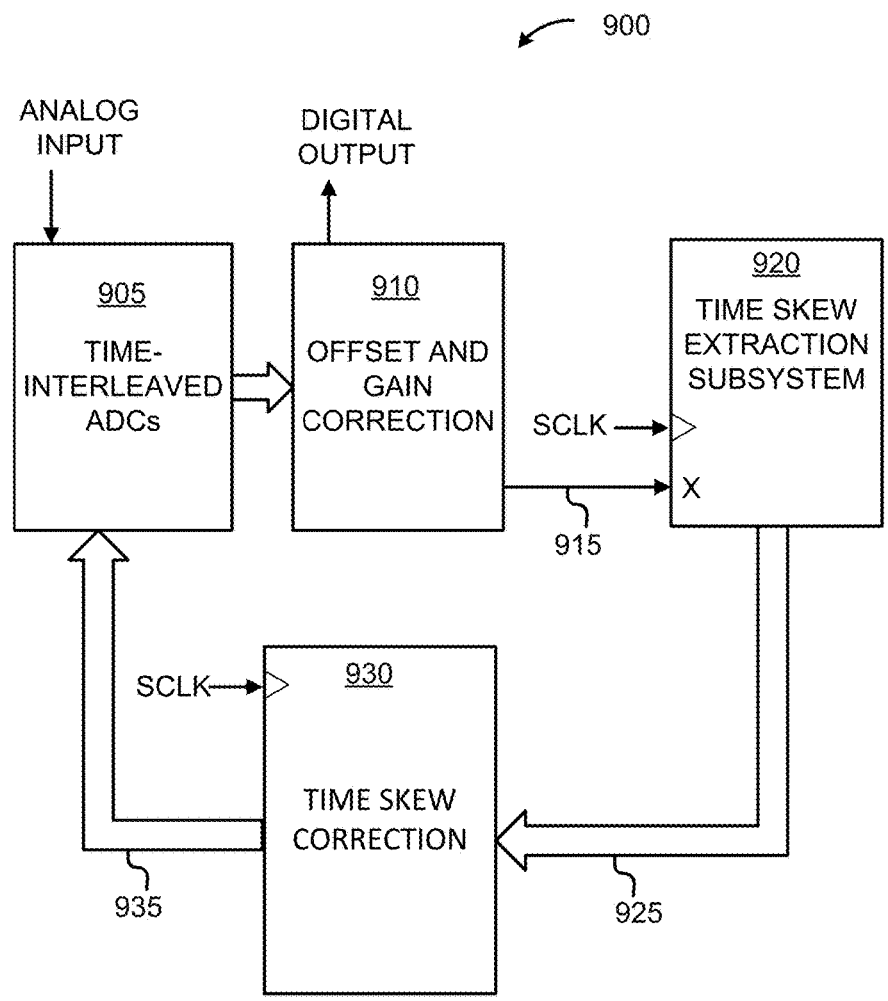
FIG. 9 depicts an exemplary clock skew calibration control loop configured to pass mixed sample data from a time-interleaved analog-to-digital converter (TIADC) to a time skew extraction subsystem.

FIG. 9 depicts an exemplary clock skew calibration control loop configured to pass mixed sample data from a time-interleaved analog-to-digital converter (TIADC) to a time skew extraction subsystem. A clock skew calibration control loop 900 includes an array of time-interleaved analog-to-digital converters (TIADCs) 905. The TIADCs 905 send time-interleaved data to an offset and gain correction circuit 910. The offset and gain correction circuit 910 sends a stream of converted and corrected data (SCACD) 915 to a time skew extraction subsystem 920. Various time skew extraction subsystems such as the time skew extraction subsystem 920 may be described, for example, with reference to FIG. 10 and FIG. 12. The time skew extraction subsystem 920 is operable to produce a set of error signals 925. Each error signal in the set of error signals 925 may represent a correction factor for a corresponding clock in a set of TIADC clocks 935. A time skew correction block 930 is configured to adjust the timing each of the TIADC clocks in the set of TIADC clocks 935 as a function of the corresponding error signal in the set of error signals 925. The set of TIADC clocks 935 are received by the TIADCs 905. The clock skew calibration control loop 900 may advantageously reduce interleaving spurs, producing a substantially higher calibration accuracy on its digital output.

Figure 10:
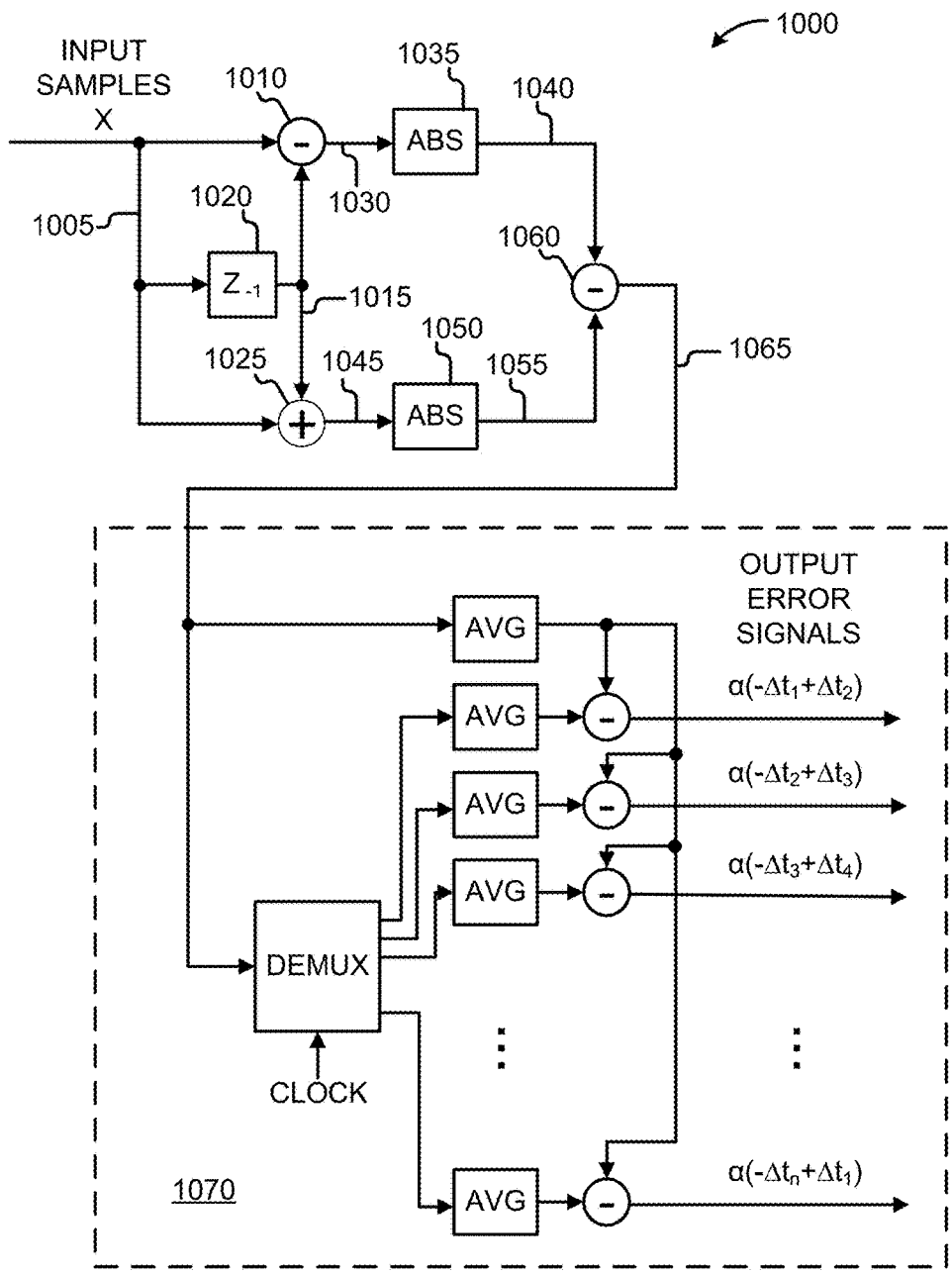
FIG. 10 depicts an exemplary time skew extraction subsystem configured with an adder and subtractor front-end.

FIG. 10 depicts an exemplary time skew extraction subsystem configured with an adder and subtractor front-end. A time skew extraction subsystem 1000 includes a data input signal stream 1005. The data input signal stream 1005 is received by a subtractor functional block 1010. The subtractor functional block 1010 also receives a previous sample 1015 from a previous sample functional block 1020. The data input signal stream 1005 is received by an adder functional block 1025. The adder functional block 1025 also receives the previous sample 1015.

The subtractor functional block 1010 is operable to produce a subtraction result data signal stream 1030 between the data input signal stream 1005 and the previous sample 1015. The subtraction result data signal stream 1030 is received by an absolute value functional block 1035. The absolute value functional block 1035 is operable to produce a difference data signal stream 1040.

The adder functional block 1025 is operable to produce an addition result data signal stream 1045 of the data input signal stream 1005 and the previous sample 1015. The addition result data signal stream 1045 is received by an absolute value functional block 1050. The absolute value functional block 1050 is operable to produce a sum data signal stream 1055.

The difference data signal stream 1040 and the sum data signal stream 1055 are combined by a subtractor functional block 1060. The subtractor functional block 1060 is operable to combine the difference data signal stream 1040 and the sum data signal stream 1055 to produce a combined data signal stream 1065.

The combined data signal stream 1065 is sent to an error processing functional block 1070. Various examples of error processing functional blocks, such as the error processing functional block 1070, that may be suitable for some embodiments are described, for example, with reference to elements 204, 208 and 212 of FIG. 2, and with reference to elements 404, 408, and 412 of FIG. 4 of Erdmann-2013. The time skew extraction subsystem 1000 may be implemented, for example, in the time skew extraction subsystem 920 in FIG. 9. The time skew extraction subsystem 1000 may advantageously facilitate reduction of interleaving spurs and may facilitate production of a substantially higher calibration accuracy in various clock skew calibration control loops, such as the clock skew calibration control loop 900, for example.

Figure 11:
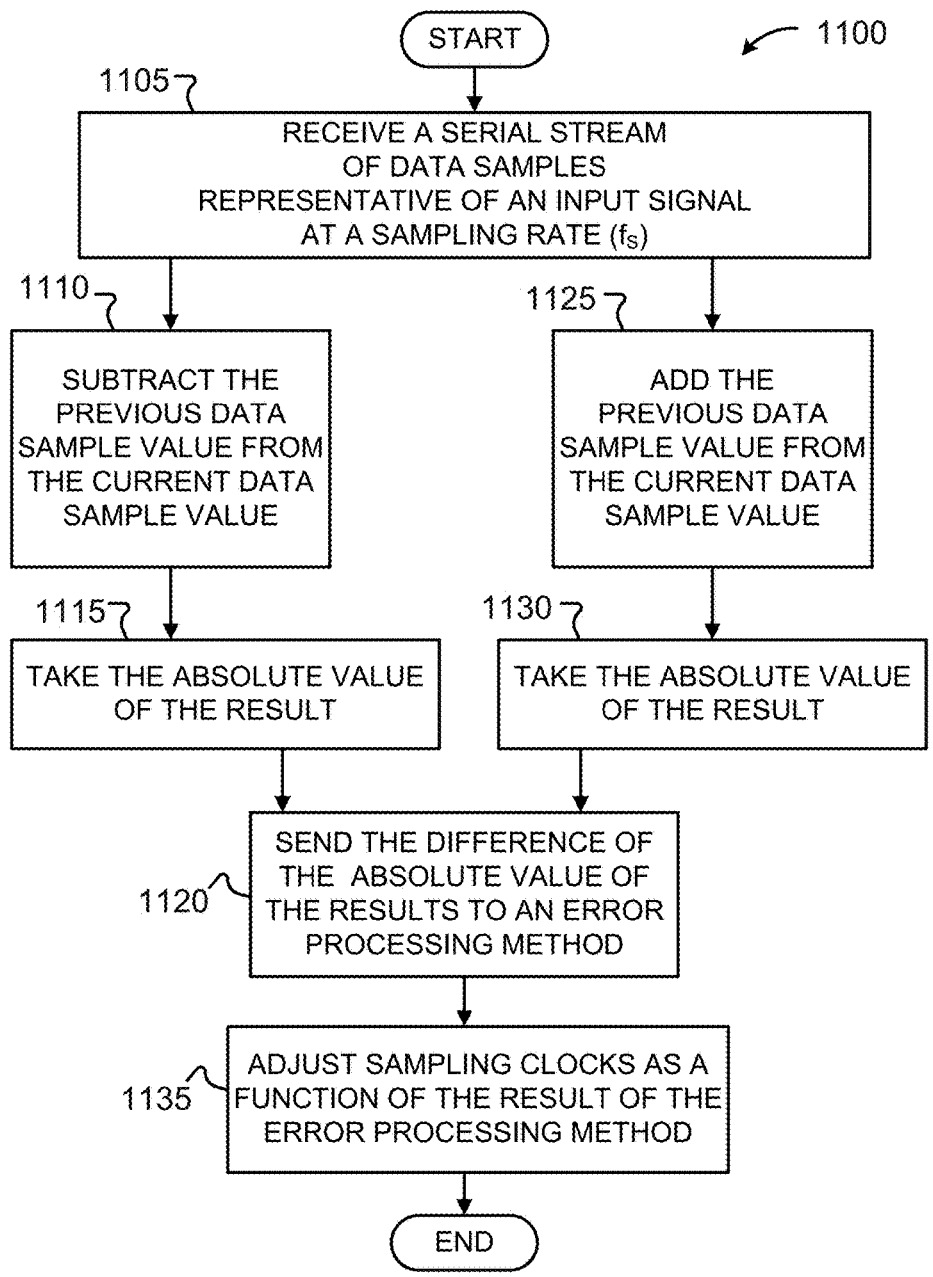
FIG. 11 depicts a flowchart of exemplary clock skew calibration control loop method including a time skew extraction subsystem method configured with an adder and subtractor front-end.

FIG. 11 depicts a flowchart of exemplary clock skew calibration control loop method including a time skew extraction subsystem method configured with an adder and subtractor front-end. A clock skew calibration control method 1100 begins at process block 1105. At process block 1105 the method 1100 receives a serial stream data samples representative of an input signal at a sampling rate $f_S$. Next, the method 1100 follows two threads. In a first thread, at process block 1110, the method 1100 subtracts the previous data sample value from the current data sample value. Next, at process block 1115, the method 1100 takes the absolute value of the result from process block 1110. Next, at process block 1120 the method 1100 sends the difference of the absolute value of the results to an error processing method. Various examples of error processing methods that may be suitable for some embodiments are described, for example, with reference to elements 308-316 of FIG. 3, elements 516-516 of FIG. 5, and elements 810-818 of FIG. 8 of Erdmann-2013.

In a second thread at process block 1125, the method 1100 adds the previous data sample value from the current data sample value. Next, at process block 1130, the method 1100 takes the absolute value of the result from process block 1125. Next, at process block 1120 the method 1100 sends the difference of the absolute value of the results to an error processing method. Next at process block 1135, the method 1100 adjusts the sampling clocks as a function of the result of the error processing method.

Figure 12:
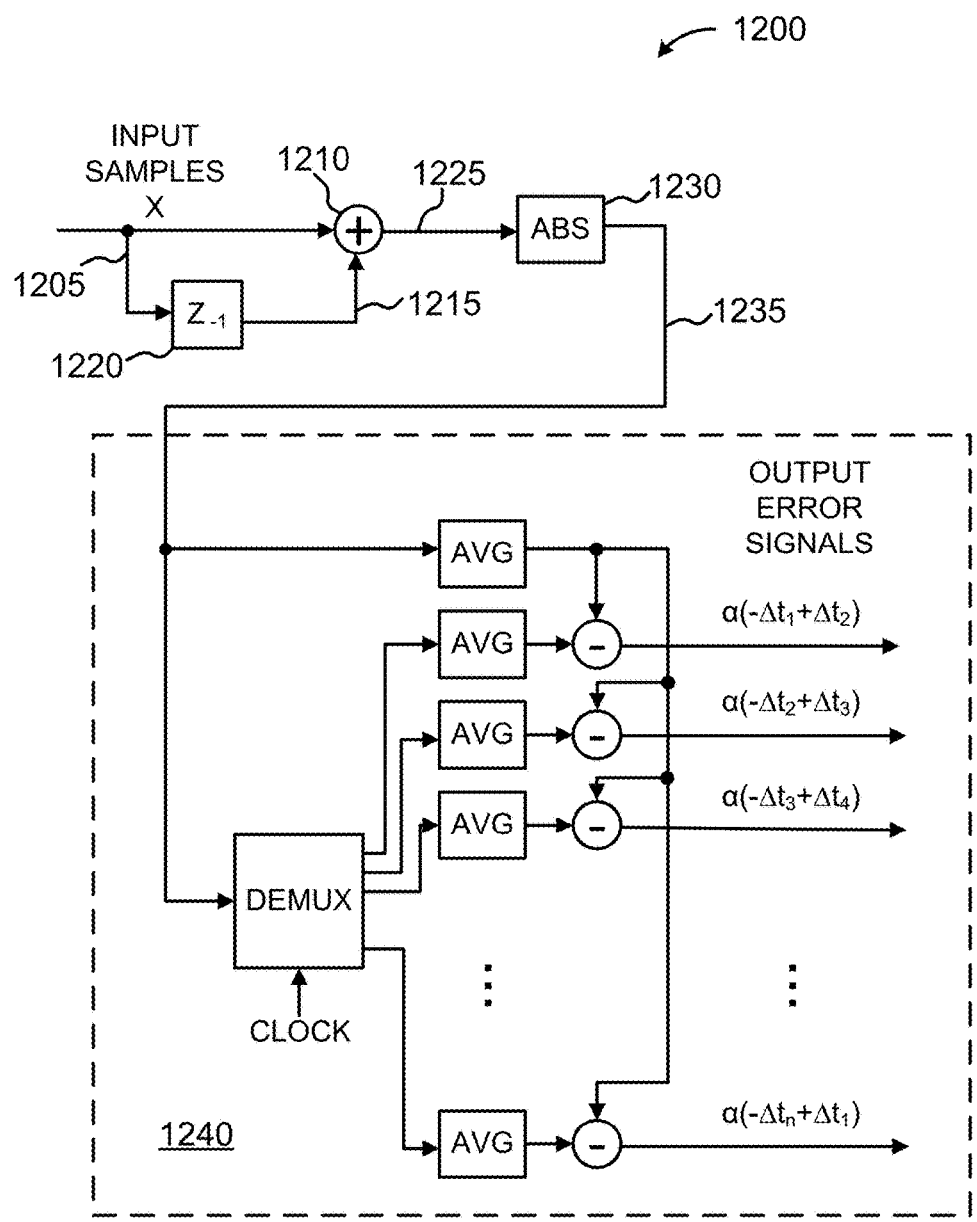
FIG. 12 depicts an exemplary time skew extraction subsystem configured with an adder front-end.

FIG. 12 depicts an exemplary time skew extraction subsystem configured with an adder front-end. A time skew extraction subsystem 1200 includes a data input signal stream 1205. The data input signal stream 1205 is received by an adder functional block 1210. The adder functional block 1210 also receives a previous sample 1215 from a previous sample functional block 1220.

The adder functional block 1210 is operable to produce an addition result data signal stream 1225 of the data input signal stream 1205 and the previous sample 1215. The addition result data signal stream 1225 is received by an absolute value functional block 1230. The absolute value functional block 1230 is operable to produce a sum data signal stream 1235.

The sum data signal stream 1235 is sent to an error processing functional block 1240. Various examples of error processing functional blocks, such as the error processing functional block 1240, that may be suitable for some embodiments are described, for example, with reference to elements 204, 208 and 212 of FIG. 2, and with reference to elements 404, 408, and 412 of FIG. 4 of Erdmann-2013. The time skew extraction subsystem 1200 may be implemented, for example, in the time skew extraction subsystem 920 with reference to FIG. 9. The time skew extraction subsystem 1200 may advantageously facilitate reduction of interleaving spurs and may facilitate production of a substantially higher accuracy in various clock skew calibration control loops, such as the clock skew calibration control loop 900, for example.

Figure 13:
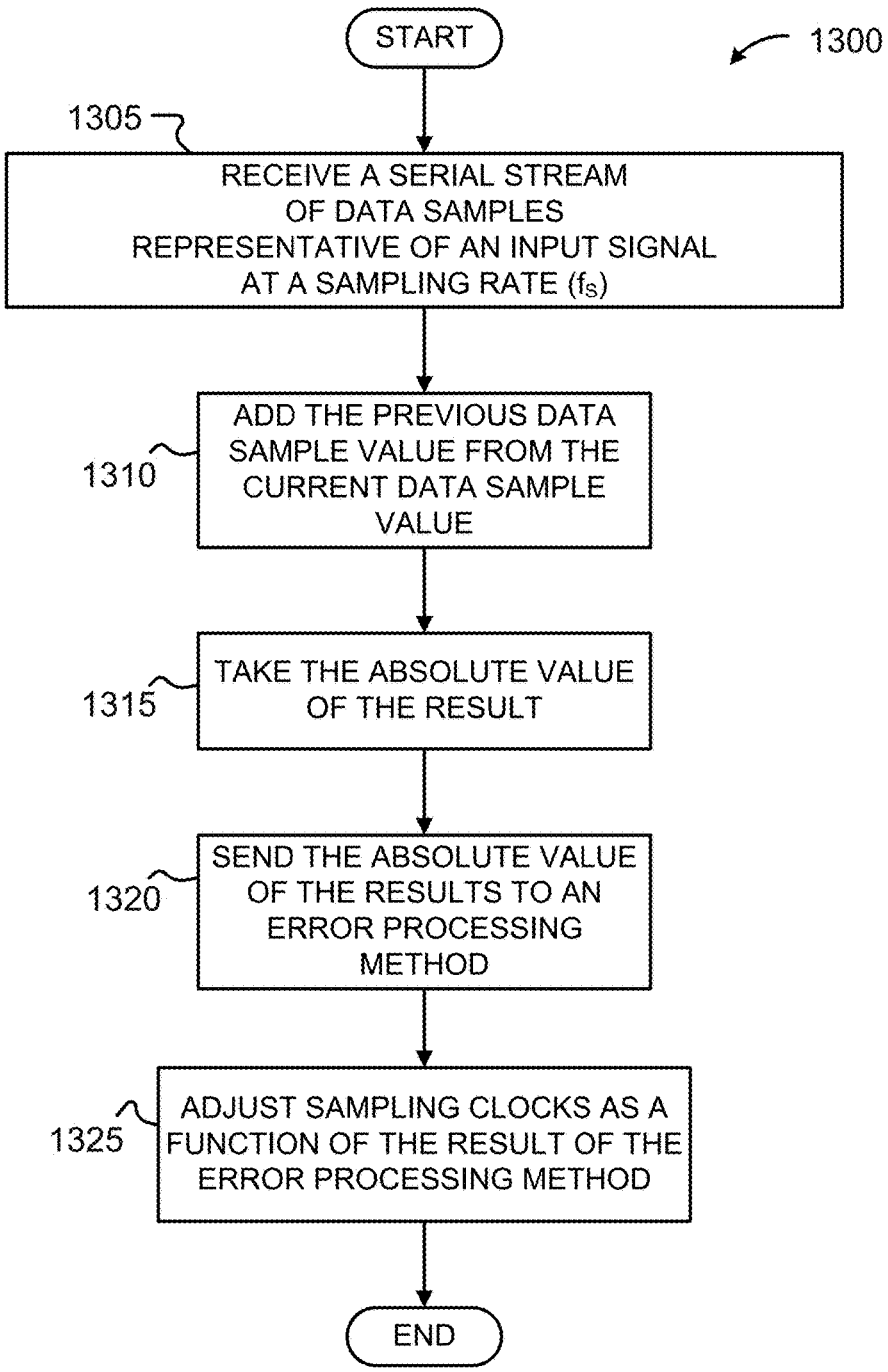
FIG. 13 depicts a flowchart of exemplary clock skew calibration control loop method including a time skew extraction subsystem method configured with an adder front-end.

FIG. 13 depicts a flowchart of exemplary clock skew calibration control loop method including a time skew extraction subsystem method configured with an adder front-end. A clock skew calibration control method 1300 begins at process block 1305. At process block 1305 the method 1300 receives a serial stream data samples representative of an input signal at a sampling rate $f_S$. Next, at process block 1310, the method 1300 adds the previous data sample value from the current data sample value. Next, at process block 1315, the method 1300 takes the absolute value of the result from process block 1310. Next, at process block 1320 the method 1300 sends the absolute values of the results to an error processing method. Next at process block 1325, the method 1300 adjusts the sampling clocks as a function of the result of the error processing method.

Figure 14:
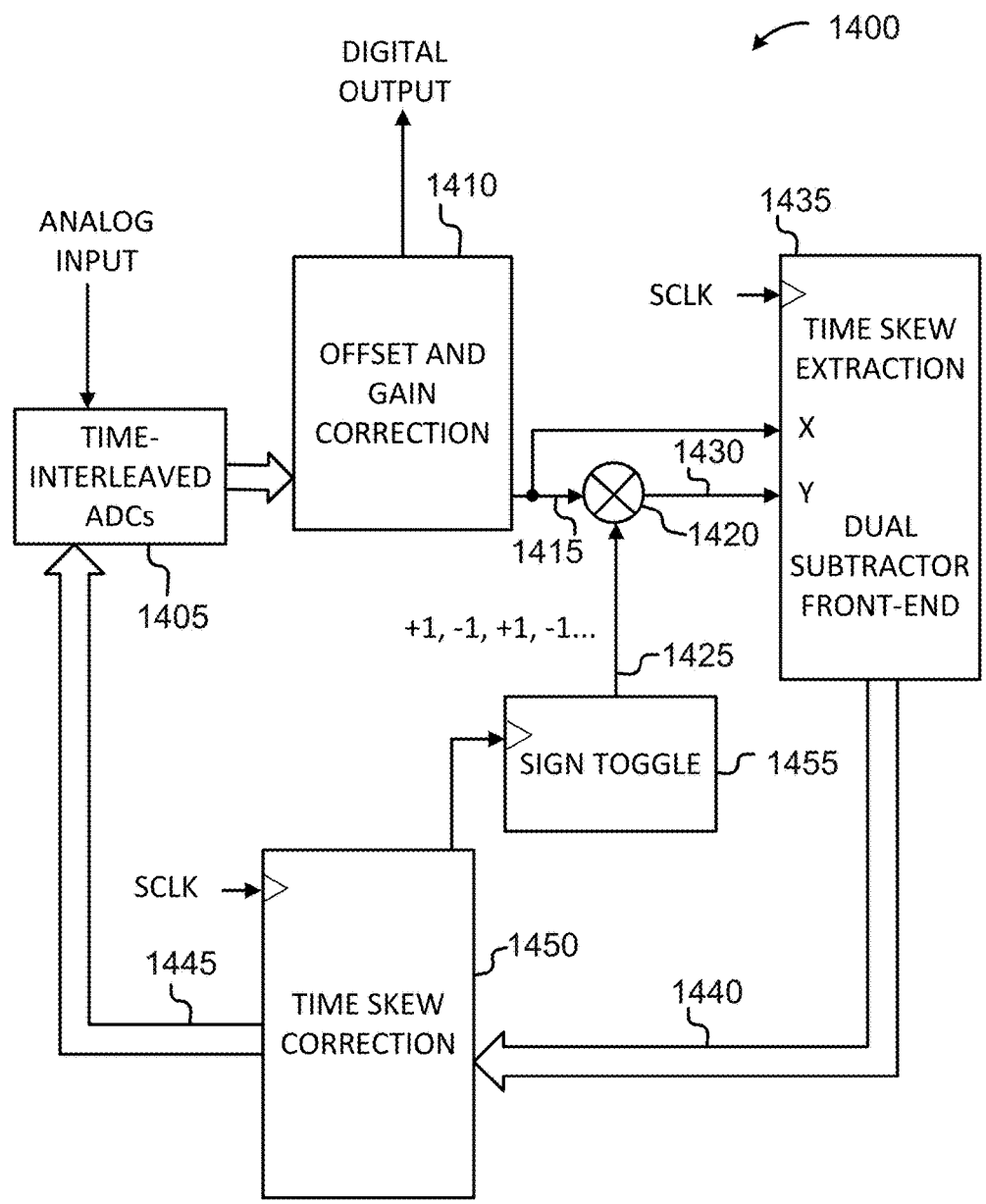
FIG. 14 depicts an exemplary clock skew calibration control loop, providing mixed sample data and non-mixed sample data to a time skew extraction subsystem with a dual subtractor front-ends.

FIG. 14 depicts an exemplary clock skew calibration control loop, providing mixed sample data and non-mixed sample data to a time skew extraction subsystem with a dual subtractor front-ends. A clock skew calibration control loop 1400 includes an array of time-interleaved analog-to-digital converters (TIADCs) 1405. The TIADCs 1405 send time-interleaved data to an offset and gain correction circuit 1410. The offset and gain correction circuit 1410 sends a stream of converted and corrected data (SCACD) 1415 to a multiplier-mixer 1420. The multiplier-mixer 1420 also receives a stream of positive and negative ones (SPNOs) 1425 in an alternating fashion. The SPNOs 1425 in combination with the SCACD 1415 cause the multiplier-mixer 1420 to produce a mixed SCACD 1430, such that every other sample in the mixed SCACD 1430 is a reverse polarity of the SCACD 1415.

The mixed SCACD 1430 is sent to a time skew extraction subsystem 1435. Various time skew extraction subsystems such as the time skew extraction subsystem 1435 may be described, for example, in Erdmann-2013. The time skew extraction subsystem 1435 is operable to produce a set of error signals 1440. Each error signal in the set of error signals 1440 may represent a correction factor for a corresponding clock in a set of TIADC clocks 1445. A time skew correction block 1450 is configured to adjust the timing each of the TIADC clocks in the set of TIADC clocks 1445 as a function of the corresponding error signal in the set of error signals 1440. The set of TIADC clocks 1445 are received by the TIADCs 1405. The SPNOs 1425 are generated by a sign toggle method 1455. The sign toggle method 1455 is clocked by the time skew correction block 1450. Accordingly, the multiplier-mixer 1420 producing a reverse sign polarity on every other data sample (e.g., producing the mixed SCACD 1430 on the SCACD 1415) coupled to the input of a time skew extraction subsystem may facilitate loop control of a set of clocking signals to an associated array of TIADCs such that the calibration accuracy of the converted data may exceed the calibration accuracy of systems without the sign polarity reversal, in specific frequency bands. The SCACD 1415, which may be referred to as "non-mixed data" and the mixed SCACD 1430, which may be referred to as "mixed data" are coupled to two inputs of the time skew extraction subsystem 1435.

Figure 15:
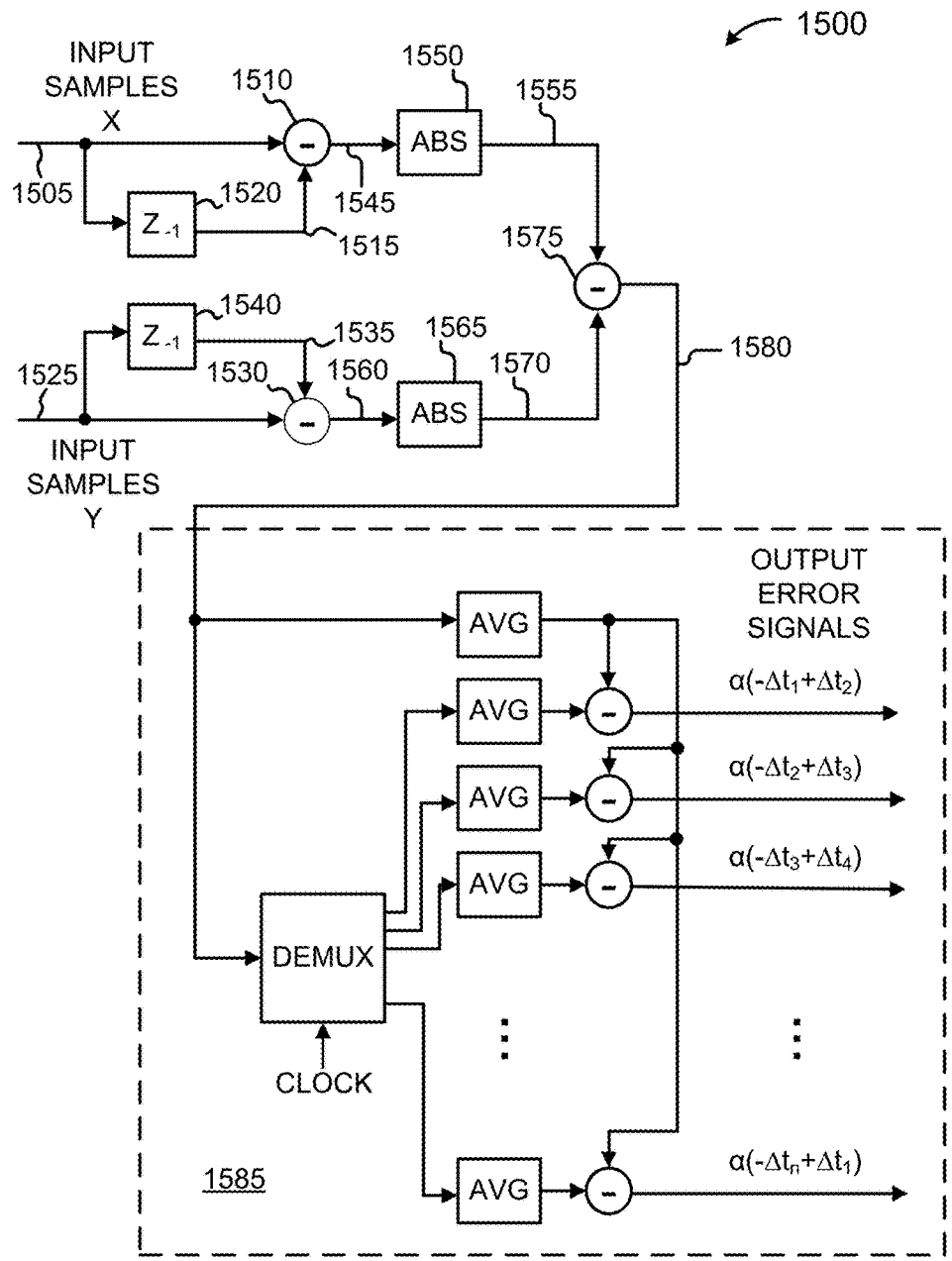
FIG. 15 depicts an exemplary time skew extraction subsystem configured with two subtractor front-ends.

FIG. 15 depicts an exemplary time skew extraction subsystem configured with two subtractor front-ends. A time skew extraction subsystem 1500 includes an X data input signal stream 1505, which may be, for example, a non-mixed sample data such as the SCACD 1415 of FIG. 14. The X data input signal stream 1505 is received by a subtractor functional block 1510. The subtractor functional block 1510 also receives a previous sample 1515 from a previous sample functional block 1520. The time skew extraction subsystem 1500 may be implemented, for example, in the time skew extraction subsystem 1435 in FIG. 14. The time skew extraction subsystem 1500 may advantageously facilitate reduction of interleaving spurs and may facilitate production of a substantially higher calibration accuracy in various clock skew calibration control loops, such as the clock skew calibration control loop 1400, for example.

The time skew extraction subsystem 1500 includes a Y data input signal stream 1525, which may be, for example, a mixed sample data such as the mixed SCACD 1430 of FIG. 14. The Y data input signal stream 1525 is received by a subtractor functional block 1530. The subtractor functional block 1530 also receives a previous sample 1535 from a previous sample functional block 1540.

The subtractor functional block 1510 is operable to produce a subtraction result data signal stream 1545 between the X data input signal stream 1505 and the previous sample 1515. The subtraction result data signal stream 1545 is received by an absolute value functional block 1550. The absolute value functional block 1550 is operable to produce a difference data signal stream 1555.

The subtractor functional block 1530 is operable to produce a subtraction result data signal stream 1560 of the Y data input signal stream 1525 and the previous sample 1535. The subtraction result data signal stream 1560 is received by an absolute value functional block 1565. The absolute value functional block 1565 is operable to produce a difference data signal stream 1570.

The difference data signal stream 1555 and the difference data signal stream 1570 are combined by a subtractor functional block 1575. The subtractor functional block 1575 is operable to combine the difference data signal stream 1555 and the difference data signal stream 1570 to produce a combined data signal stream 1580.

The combined data signal stream 1580 is sent to an error processing functional block 1585. Various examples of error processing functional blocks, such as error processing functional block 1585, that may be suitable for some embodiments are described, for example, with reference to elements 204, 208 and 212 of FIG. 2, and with reference to elements 404, 408, and 412 of FIG. 4 of Erdmann-2013.

Figure 16:
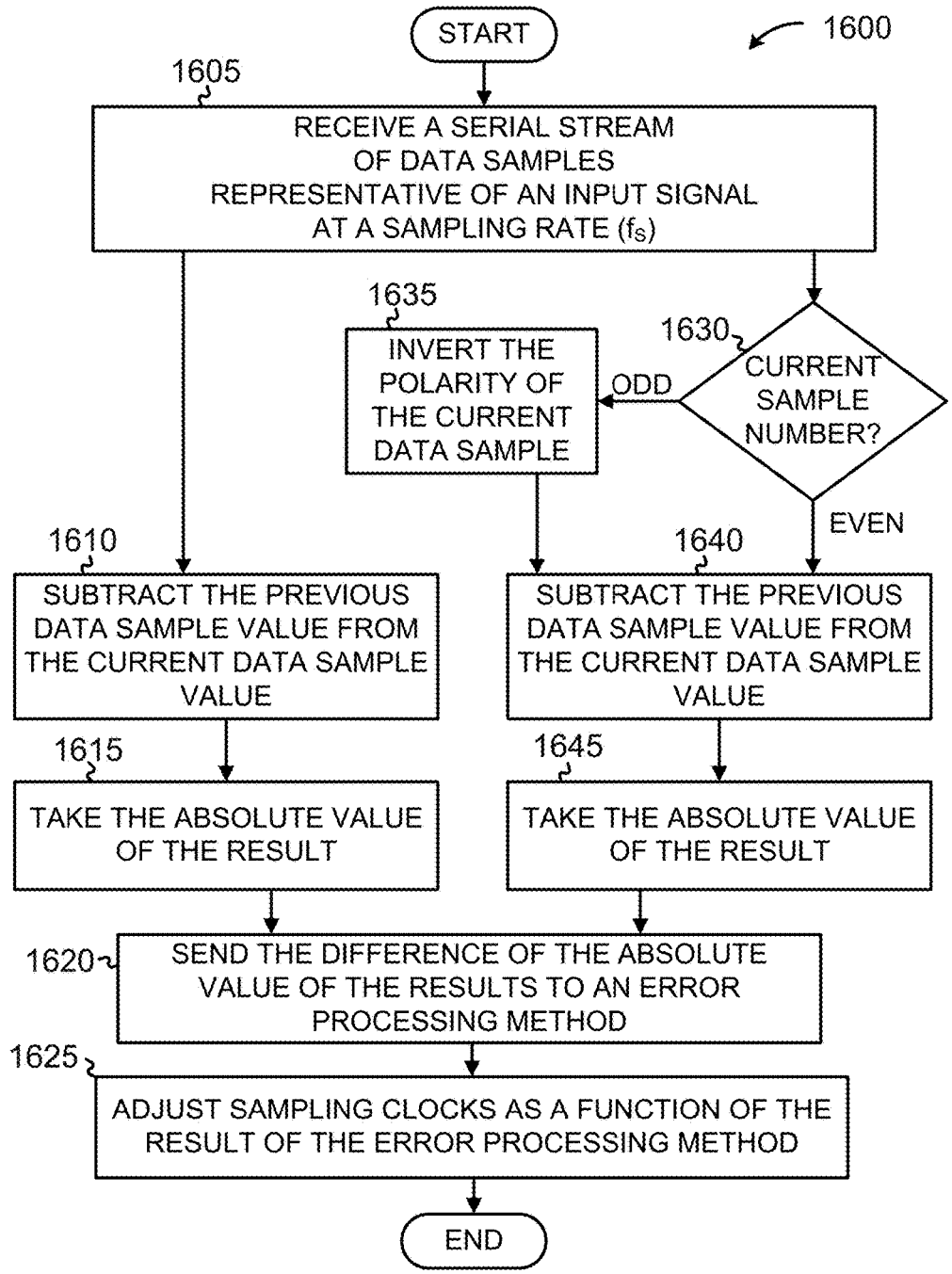
FIG. 16 depicts a flowchart of a clock skew calibration control loop method including a time skew extraction subsystem method configured with two subtractor front-ends.

FIG. 16 depicts a flowchart of a clock skew calibration control loop method including a time skew extraction subsystem method configured with two subtractor front-ends. A clock skew calibration control method 1600 begins at process block 1605. At process block 1605 the method 1600 receives a serial stream data samples representative of an input signal at a sampling rate $f_S$. Next, the method 1600 follows two threads. In the first thread, at process block 1610, the method 1600 subtracts the previous data sample value from the current data sample value. Next, at process block 1615, the method 1600 takes the absolute value of the result from process block 1610. Next, at process block 1620 the method 1600 sends the difference of the absolute value of the results to an error processing method. Various examples of error processing methods that may be suitable for some embodiments are described, for example, with reference to elements 308-316 of FIG. 3, elements 516-516 of FIG. 5, and elements 810-818 of FIG. 8 of Erdmann-2013. Next at process block 1625, the method 1600 adjusts the sampling clocks as a function of the result of the error processing method.

In a second thread at process block 1630, the method 1600 determines a sample number of the serial stream of data samples. In the depicted example, if the current sample number is odd, then the method 1600 reverses the polarity of the current sample's data value at process block 1635. The method 1600 then continues to process block 1640. At process block 1630, if the current sample number is even, then the method 1600 leaves the polarity of the current sample's data value intact, then continues to process block 1640. Next, at process block 1640, the method 1600 subtracts the previous data sample value from the current data sample value. Next, at process block 1645, the method 1600 takes the absolute value of the result from process block 1640. Execution of the method 1600 then jumps to process step 1620.

Although various embodiments have been described with reference to the figures, other embodiments are possible. For example, various time-interleaved analog-to-digital converter clock manipulators (TIADCCMs) may be implemented in remote radio heads, for example, in wireless digital networks. Some TIADCCMs may be implemented in backhaul modems, for example. Accordingly, various exemplary TIADCCMs may operate independently of programmable logic, for example, independent of an FPGA, and may be applied to various implementations of TIADCs to digitize a wideband signal.

In various examples, the circuits referenced may be methods. For example, in various gain and offset circuits, circuits or methods may implement a function that generates a data stream that is a substantially mismatch-free offset and gain output.

Conversely, the methods referenced may be circuits. For example, in various sign toggle methods, circuits or methods may implement a function such that when a sample clock (sclk) is low, a unity magnitude generated may be −1. Accordingly, when a sample clock (sclk) is high, a unity magnitude generated may be +1. In some examples, the magnitudes described may be reversed.

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a programmable processor; and methods can be performed by a programmable processor executing a program of instructions to perform functions of various embodiments by operating on input data and generating an output. Some embodiments may be implemented advantageously in one or more computer programs that are executable on a programmable system including at least one programmable processor coupled to receive data and instructions from, and to transmit data and instructions to, a data storage system, at least one input device, and/or at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example and not limitation, both general and special purpose microprocessors, which may include a single processor or one of multiple processors of any kind of computer. Generally, a processor will receive instructions and data from a read-only memory or a random-access memory or both. The essential elements of a computer are a processor for executing instructions and one or more memories for storing instructions and data. Storage devices suitable for tangibly embodying computer program instructions and data include all forms of non-volatile memory, including, by way of example, semiconductor memory devices, such as EPROM, EEPROM, flash memory devices; magnetic disks, such as internal hard disks and removable disks; magneto-optical disks; and, CD-ROM and DVD-ROM disks. The processor and the memory can be supplemented by, or incorporated in, ASICs (application-specific integrated circuits). In some embodiments, the processor and the member can be supplemented by, or incorporated in hardware programmable devices, such as FPGAs, for example.

In some implementations, each system may be programmed with the same or similar information and/or initialized with substantially identical information stored in volatile and/or non-volatile memory. For example, one data interface may be configured to perform auto configuration, auto download, and/or auto update functions when coupled to an appropriate host device, such as a desktop computer or a server.

In some implementations, one or more user-interface features may be custom configured to perform specific functions. An exemplary embodiment may be implemented in a computer system that includes a graphical user interface and/or an Internet browser. To provide for interaction with a user, some implementations may be implemented on a computer having a display device, such as an LCD (liquid crystal display) monitor for displaying information to the user, a keyboard, and a pointing device, such as a mouse or a trackball by which the user can provide input to the computer.

In various implementations, the system may communicate using suitable communication methods, equipment, and techniques. For example, the system may communicate with compatible devices (e.g., devices capable of transferring data to and/or from the system) using point-to-point communication in which a message is transported directly from a source to a first receiver over a dedicated physical link (e.g., fiber optic link, point-to-point wiring, daisy-chain). The components of the system may exchange information by any form or medium of analog or digital data communication, including packet-based messages on a communication network. Examples of communication networks include, e.g., a LAN (local area network), a WAN (wide area network), MAN (metropolitan area network), wireless and/or optical networks, and the computers and networks forming the Internet. Other implementations may transport messages by broadcasting to all or substantially all devices that are coupled together by a communication network, for example, by using omni-directional radio frequency (RF) signals. Still other implementations may transport messages characterized by high directivity, such as RF signals transmitted using directional (i.e., narrow beam) antennas or infrared signals that may optionally be used with focusing optics. Still other implementations are possible using appropriate interfaces and protocols such as, by way of example and not intended to be limiting, USB 2.0, FireWire, ATA/IDE, RS-232, RS-422, RS-485, 802.11 a/b/g/n, Wi-Fi, WiFi-Direct, Li-Fi, BlueTooth, Ethernet, IrDA, FDDI (fiber distributed data interface), token-ring networks, or multiplexing techniques based on frequency, time, or code division. Some implementations may optionally incorporate features such as error checking and correction (ECC) for data integrity, or security measures, such as encryption (e.g., WEP) and password protection.

In various embodiments, a computer system may include non-transitory memory. The memory may be connected to the one or more processors may be configured for encoding data and computer readable instructions, including processor executable program instructions. The data and computer readable instructions may be accessible to the one or more processors. The processor executable program instructions, when executed by the one or more processors, may cause the one or more processors to perform various operations.

In various embodiments, the computer system may include Internet of Things (IoT) devices. IoT devices may include objects embedded with electronics, software, sensors, actuators, and network connectivity which enable these objects to collect and exchange data. IoT devices may be in-use with wired or wireless devices by sending data through an interface to another device. IoT devices may collect useful data and then autonomously flow the data between other devices.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A clock skew calibration apparatus comprising:
an array of N time-interleaved analog-to-digital converters (TIADCs) receiving an analog input signal and configured to generate a stream of originating samples in a digital format, wherein the stream rate of the generated stream is one sample per period of an overall sampling clock (sclk) having a sampling frequency $f_S$, and wherein the TIADCs are configured to receive an array of sampling clocks each having an individual sampling frequency of substantially $f_S/N$; and,
a time skew extractor circuit comprising:
a summer circuit operatively coupled to receive the generated sample stream and a stream of delayed samples of the generated sample stream, wherein the summer circuit is configured to sum two consecutive samples from the generated sample stream; and,
a first absolute value circuit operatively coupled to the summer circuit, wherein the first absolute value circuit is operatively coupled to produce an array of clock error signals as a function of the summed consecutive samples of the generated sample stream.

2. The apparatus of claim 1, wherein the first absolute value circuit further comprises a bit manipulator coupled to an output of the summer circuit for generating initial absolute values of the output of the summer circuit.

3. The apparatus of claim 1, the summer circuit further comprising a first input coupled to the generated sample stream, and a flip flop having an input coupled to receive the generated sample stream, wherein the summer circuit further comprises an output of the flip flop coupled to a second input of the summer circuit.

4. The apparatus of claim 3, the time skew extractor circuit further comprising a subtractor circuit operatively coupled to receive the generated sample stream at a first input and configured to subtract two consecutive samples from the generated sample stream.

5. The apparatus of claim 4, wherein the time skew extractor circuit further comprises the output of the flip flop coupled to a second input of the subtractor circuit.

6. The apparatus of claim 5, further comprising a second absolute value circuit operatively coupled to an output of the subtractor circuit.

7. The apparatus of claim 6, the time skew extractor circuit further comprising a combiner circuit operatively coupled to receive the respective outputs of the first and second absolute value circuits, wherein the time skew extractor circuit is operative to produce an array of clock error signals as a function of the combined absolute value outputs.

8. The apparatus of claim 7, wherein the combiner circuit further comprises a difference generator, wherein the time skew extractor circuit is operative to produce an array of clock error signals as a function of the difference of the absolute value outputs.

9. The apparatus of claim 7, further comprising time skew correction generator adapted to receive the array of clock error signals and to produce the array of sampling clocks.

10. A method to calibrate clock skew, the method comprising:
receiving, with an array of N time-interleaved analog-to-digital converters (TIADCs), an analog input signal;
generating, from the received analog input signal, a stream of originating samples in a digital format, wherein the stream rate of the generated stream is one sample per period of an overall sampling clock (sclk) having a sampling frequency $f_S$, and wherein the TIADCs are configured to receive an array of sampling clocks each having an individual sampling frequency of substantially $f_S/N$; and,
providing a time skew extractor circuit comprising a summer circuit operatively coupled to receive the generated sample stream and a stream of delayed samples of the generated sample stream;
summing, with the summer circuit, consecutive samples from the generated sample stream, and,
producing, with a first absolute value circuit operatively coupled to the summer circuit, an array of clock error signals as a function of the summed consecutive samples of the generated sample stream.

11. The method of claim 10, wherein the first absolute value circuit further comprises a bit manipulator coupled to an output of the summer circuit, and the method further comprises generating initial absolute values of the output of the summer circuit.

12. The method of claim 10, wherein the summer circuit further comprises a first input coupled to the generated sample stream, and a flip flop having an input coupled to receive the generated sample stream, wherein the summer circuit further comprises an output of the flip flop coupled to a second input of the summer circuit.

13. The method of claim 12, wherein the time skew extractor circuit further comprises a subtractor circuit operatively coupled to receive the generated sample stream at a first input, and the method further comprises subtracting, with the subtractor circuit, two consecutive samples from the generated sample stream.

14. The method of claim 13, wherein the time skew extractor circuit further comprises the output of the flip flop coupled to a second input of the subtractor circuit.

15. The method of claim 14, further comprising providing a second absolute value circuit operatively coupled to an output of the subtractor circuit.

16. A clock skew calibration apparatus comprising:
an array of N time-interleaved analog-to-digital converters (TIADCs) receiving an analog input signal and configured to generate a stream of originating samples in a digital format, wherein the stream rate of the generated stream is one sample per period of an overall sampling clock (sclk) having a sampling frequency $f_S$, and wherein the TIADCs are configured to receive an array of sampling clocks each having an individual sampling frequency of substantially $f_S/N$; and,
a sign changer circuit configured to receive the stream of originating samples and to generate a stream of mixed samples at the sampling frequency $f_S$, wherein the stream of mixed samples alternates between a sample that is a direct copy of the originating sample and a sign changed copy of the originating sample,
wherein a time skew extractor is adapted to receive the stream of mixed samples and to produce an array of clock error signals as a function of the stream of mixed samples, and, wherein a time skew correction circuit is adapted to receive the array of clock error signals and to produce the array of sampling clocks.

17. The apparatus of claim 16, further comprising a selector configured to receive the stream of originating samples and to receive the stream of mixed samples and configured to send a selected one of the received sample streams to the time skew extractor in response to a selection control signal.

18. The apparatus of claim 17, wherein the selector is configured to select between the received sample streams as a function of a frequency of the analog input signal relative to a Nyquist frequency associated with the sampling frequency fs.

* * * * *